(12) United States Patent
Chieng et al.

(10) Patent No.: US 7,908,306 B1
(45) Date of Patent: Mar. 15, 2011

(54) SRC WITH MULTIPLE SETS OF FILTER COEFFICIENTS IN MEMORY AND A HIGH ORDER COEFFICIENT INTERPOLATOR

(76) Inventors: Daniel L. W. Chieng, Austin, TX (US); Jack B. Andersen, Austin, TX (US); Larry E. Hand, Meridian, MS (US)

( * ) Notice: Subject to any disclaimer, the term of this patent is extended or adjusted under 35 U.S.C. 154(b) by 1404 days.

(21) Appl. No.: 10/805,596

(22) Filed: Mar. 19, 2004

Related U.S. Application Data

(60) Provisional application No. 60/469,735, filed on May 12, 2003, provisional application No. 60/456,414, filed on Mar. 21, 2003, provisional application No. 60/456,430, filed on Mar. 21, 2003, provisional application No. 60/456,429, filed on Mar. 21, 2003, provisional application No. 60/456,421, filed on Mar. 21, 2003, provisional application No. 60/456,422, filed on Mar. 21, 2003, provisional application No. 60/456,428, filed on Mar. 21, 2003, provisional application No. 60/456,420, filed on Mar. 21, 2003, provisional application No. 60/456,427, filed on Mar. 21, 2003.

(51) Int. Cl.
*G06F 17/10* (2006.01)
(52) U.S. Cl. ......... 708/300; 708/290; 708/313; 708/315
(58) Field of Classification Search .......... 708/290, 708/300
See application file for complete search history.

(56) References Cited

U.S. PATENT DOCUMENTS

| 4,641,326 A | | 2/1987 | Tomisawa | |
|---|---|---|---|---|
| 4,727,505 A | * | 2/1988 | Konishi et al. | 708/420 |
| 4,841,828 A | * | 6/1989 | Suzuki | 84/601 |
| 5,023,825 A | * | 6/1991 | Luthra et al. | 708/313 |
| 5,285,263 A | | 2/1994 | Fujita | |
| 5,319,584 A | * | 6/1994 | Ooyabu | 708/303 |

(Continued)

FOREIGN PATENT DOCUMENTS

GB    2 267 193    11/1993

(Continued)

OTHER PUBLICATIONS

Ketola et al., "Synchronization of Fractional Interval Counter in Non-Integer Ratio Sample Rate Converters," Proceedings of the 2003 International Symposium on Circuits and Systems, 2003 ISCAS '03, vol. 2, May 25-28, 2003, pp. 89-92.

(Continued)

*Primary Examiner* — Lewis A Bullock, Jr.
*Assistant Examiner* — Michael Yaary
(74) *Attorney, Agent, or Firm* — Fliesler Meyer LLP

(57) ABSTRACT

Systems and methods for converting a data stream from a first sample rate to a second sample rate using a sample rate converter that employs selectable filters. In one embodiment, the filters are implemented by providing multiple sets of filter coefficients in a memory, selecting one of the sets of filter coefficients and performing coefficient interpolation to produce filter coefficients that are convolved with the input data stream to produce a re-sampled output data stream. The input signal can be an audio signal that is convolved with interpolated polyphase filter coefficients in the sample rate converter of a digital PWM audio amplifier. The set of filter coefficients can be selected by a value stored in a filter selection register that is modifiable by a DSP or by user input. The sets of filter coefficients can be stored in a single memory and interpolated according to a cubic spline interpolation algorithm.

18 Claims, 5 Drawing Sheets

U.S. PATENT DOCUMENTS

| | | | |
|---|---|---|---|
| 5,367,162 A | | 11/1994 | Holland et al. |
| 5,471,411 A | * | 11/1995 | Adams et al. ............... 708/300 |
| 5,475,628 A | | 12/1995 | Adams et al. |
| 5,481,568 A | | 1/1996 | Yada |
| 5,621,805 A | | 4/1997 | Loh et al. |
| 5,648,922 A | * | 7/1997 | Han ............................ 708/315 |
| 5,907,295 A | | 5/1999 | Lin |
| 5,928,313 A | * | 7/1999 | Thompson .................. 708/313 |
| 5,986,589 A | | 11/1999 | Rosefield et al. |
| 6,044,113 A | | 3/2000 | Oltean |
| 6,057,789 A | | 5/2000 | Lin |
| 6,061,410 A | | 5/2000 | Linz |
| 6,124,895 A | | 9/2000 | Fielder |
| 6,134,268 A | | 10/2000 | McCoy |
| 6,324,235 B1 | | 11/2001 | Savell et al. |
| 6,393,198 B1 | | 5/2002 | LaMacchia |
| 6,411,333 B1 | * | 6/2002 | Auld et al. ................... 348/441 |
| 6,531,970 B2 | | 3/2003 | McLaughlin et al. |
| 6,593,807 B2 | | 7/2003 | Groves et al. |
| 6,665,338 B1 | | 12/2003 | Midya et al. |
| 6,765,931 B1 | | 7/2004 | Rabenko et al. |
| 6,819,732 B1 | | 11/2004 | Savell |
| 7,023,868 B2 | | 4/2006 | Rabenko et al. |
| 7,167,112 B2 | | 1/2007 | Andersen et al. |
| 7,236,109 B1 | | 6/2007 | Duewer et al. |
| 7,262,716 B2 | | 8/2007 | Yu et al. |
| 7,474,722 B1 | | 1/2009 | Chieng et al. |
| 2002/0046227 A1 | * | 4/2002 | Goszewski et al. .......... 708/313 |
| 2002/0105448 A1 | | 8/2002 | Friedhof |
| 2002/0190880 A1 | | 12/2002 | McLaughlin et al. |
| 2003/0037297 A1 | | 2/2003 | Araki |
| 2003/0074381 A1 | * | 4/2003 | Awad et al. .................. 708/322 |
| 2003/0179116 A1 | | 9/2003 | Oki |

FOREIGN PATENT DOCUMENTS

| | | |
|---|---|---|
| JP | 2002-314429 | 10/2002 |
| JP | 2008-018518 | 1/2008 |

OTHER PUBLICATIONS

Park et al., "A Novel Structure for Real-Time Digital Sample-Rate Converters with Finite Precision Error Analysis," Speech Processing 2. VLSI, Underwater Signal Processing, Toronto, May 14-17, 1991, International Conference on Acoustics, Speech and Signal Processing, ICASSP, NY, IEEE, US, vol. 2, Conf. 16, Apr. 14, 1991, 4 pages.

* cited by examiner

SRC WITH MULTIPLE SETS OF FILTER COEFFICIENTS IN MEMORY AND A HIGH ORDER COEFFICIENT INTERPOLATOR

RELATED APPLICATIONS

This application claims priority to U.S. Provisional Patent Application No. 60/469,735, entitled "SRC with Multiple Sets of Filter Coefficients in Memory and a High Order Coefficient Interpolator," by Chieng, et al., filed May 12, 2003; U.S. Provisional Patent Application No. 60/456,414, entitled "Adaptive Anti-Clipping Protection," by Taylor, et al., filed Mar. 21, 2003; U.S. Provisional Patent Application No. 60/456,430, entitled "Frequency Response Correction," by Taylor, et al., filed Mar. 21, 2003; U.S. Provisional Patent Application No. 60/456,429, entitled "High-Efficiency, High-Performance Sample Rate Converter," by Andersen, et al., filed Mar. 21, 2003; U.S. Provisional Patent Application No. 60/456,421, entitled "Output Device Switch Timing Correction," by Taylor, et al., filed Mar. 21, 2003; U.S. Provisional Patent Application No. 60/456,422, entitled "Output Filter, Phase/Timing Correction," by Taylor, et al., filed Mar. 21, 2003; U.S. Provisional Patent Application No. 60/456,428, entitled "Output Filter Speaker/Load Compensation," by Taylor, et al., filed Mar. 21, 2003; U.S. Provisional Patent Application No. 60/456,420, entitled "Output Stage Channel Timing Calibration," by Taylor, et al., filed Mar. 21, 2003; U.S. Provisional Patent Application No. 60/456,427, entitled "Intelligent Over-Current, Over-Load Protection," by Hand, et al., filed Mar. 21, 2003; each of which is fully incorporated by reference as if set forth herein in its entirety.

BACKGROUND OF THE INVENTION

1. Field of the Invention

The invention relates generally to audio amplification systems, and more particularly to systems and methods for converting data streams at a first sample rate to a second sample rate using a coefficient interpolator that interpolates selectable sets of coefficients.

2. Related Art

Pulse Width Modulation (PWM) or Class D signal amplification technology has existed for a number of years. PWM technology has become more popular with the proliferation of Switched Mode Power Supplies (SMPS). Since this technology emerged, there has been an increased interest in applying PWM techniques in signal amplification applications as a result of the significant efficiency improvement that can be realized through the use of Class D power output topology instead of the legacy (linear Class AB) power output topology.

Early attempts to develop signal amplification applications utilized the same approach to amplification that was being used in the early SMPS. More particularly, these attempts utilized analog modulation schemes that resulted in very low performance applications. These applications were very complex and costly to implement. Consequently, these solutions were not widely accepted. Prior art analog implementations of Class D technology have therefore been unable to displace legacy Class AB amplifiers in mainstream amplifier applications.

Recently, digital PWM modulation schemes have surfaced. These schemes use Sigma-Delta modulation techniques to generate the PWM signals used in the newer digital Class D implementations. These digital PWM schemes, however, did little to offset the major barriers to integration of PWM modulators into the total amplifier solution. Class D technology has therefore continued to be unable to displace legacy Class AB amplifiers in mainstream applications.

One of the problems with conventional implementations of Class D technology lies in the conversion of the digital input data from an input sample rate to an internal sample rate. This process usually involves upsampling and then downsampling the input audio signal to achieve the desired sample rate and filtering the signal either during the up/downsampling or thereafter.

The upsampling and downsampling of the input audio signal may be performed using a polyphase filter. Rather than generating a large number of samples and then throwing away unneeded samples, the polyphase filter generates only those samples that will be retained. In order to achieve good performance, however, it is typically necessary to store $2^{18}$ filter coefficients that define the filter. It is impractical to store this large number of coefficients. Further, when designing such a filter for this purpose, there are inherent tradeoffs between, for example, passband ripple, stopband rejection and rolloff. Because of the tradeoffs, it is difficult to design a filter that is optimal to cover multiple applications. It would likewise be impractical to have change all of these coefficients to modify the frequency response characteristics for the filter.

A sample rate converter (SRC) based on multirate signal processing requires an interpolation filter. When designing such an FIR low pass filter, there are inherent tradeoffs between passband ripple, stopband rejection and rolloff. This makes it hard to determine an optimal filter to cover multiple applications.

SUMMARY OF THE INVENTION

One or more of the problems outlined above may be solved by the various embodiments of the invention. Broadly speaking, the invention comprises systems and methods for converting a data stream from a first sample rate to a second sample rate using a sample rate converter that employs selectable filters. The filters are implemented by providing multiple sets of filter coefficients in a memory, selecting one of the sets of filter coefficients and performing coefficient interpolation to produce filter coefficients that are convolved with the input data stream to produce a re-sampled output data stream.

One embodiment comprises a method including storing a plurality of sets of filter coefficients in a memory, selecting a first one of the sets of filter coefficients, interpolating the first selected set of filter coefficients and convolving the interpolated first selected filter coefficients with an input signal to produce a filtered output signal. In one embodiment, the input signal is an audio signal that is convolved with interpolated polyphase filter coefficients in the sample rate converter of a digital audio amplifier such as a PWM amplifier. In one embodiment, the set of filter coefficients is selected according to a value that is stored in a filter selection register. The value in the register may be set by a DSP or by a user. In one embodiment, the sets of filter coefficients are all stored in a single memory and are interpolated according to a cubic spline interpolation algorithm.

An alternative embodiment of the invention comprises a system including a coefficient interpolator and a memory coupled to the coefficient interpolator, where the memory is configured to store multiple sets of filter coefficients and the coefficient interpolator is configured to interpolate a selected one of the sets of filter coefficients. In one embodiment, the system includes a filter selection register that stores a filter selection value. In this embodiment, the coefficient interpolator is configured to select the set of filter coefficients indicated by this filter selection value. The filter selection value in the register may be modified by a user or by a DSP within the system. In one embodiment, the system may include a convolution engine configured to convolve an input signal with the interpolated coefficients to produce an output signal. In one embodiment, the system is implemented in a sample rate converter of a PWM amplifier. In one embodiment, the sets of filter coefficients are all stored in a single memory and are interpolated according to a cubic spline interpolation algorithm.

Numerous additional embodiments are also possible.

BRIEF DESCRIPTION OF THE DRAWINGS

Other objects and advantages of the invention may become apparent upon reading the following detailed description and upon reference to the accompanying drawings.

Figure 1:
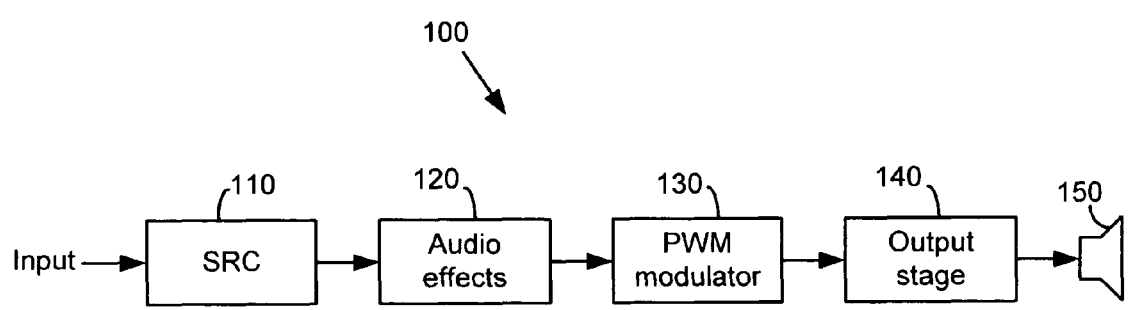
FIG. 1 is a functional block diagram illustrating a digital audio amplification system using PWM technology.

While the invention is subject to various modifications and alternative forms, specific embodiments thereof are shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the scope of the present invention as defined by the appended claims.

DETAILED DESCRIPTION OF PREFERRED EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods for converting a data stream from a first sample rate to a second sample rate using a sample rate converter that employs selectable filters. The filters are implemented by providing multiple sets of filter coefficients in a memory, selecting one of the sets of filter coefficients and performing coefficient interpolation to produce filter coefficients that are convolved with the input data stream to produce a re-sampled output data stream.

A sample rate converter (SRC) based on multirate signal processing requires an interpolation filter. When designing such an FIR low pass filter, there are inherent tradeoffs between passband ripple, stopband rejection and rolloff. This makes it hard to determine an optimal filter to cover multiple applications. One solution to this problem is to keep multiple filters in the memory (ROM or RAM). Each set of filter coefficients is selectable by the software via a register setting, allowing the digital signal processor (DSP) to choose the best filter for a particular application. To achieve good performance, filter coefficients in the order of $2^{18}$ have to be stored for each filter. This is impractical for a single filter, much less multiple filters. A solution to memory size reduction is to store a subset of coefficients and use high order interpolator is interpolate actual coefficients.

Existing SRCs may store one set of FIR filter coefficients, or one set of filter coefficients plus the difference of two adjacent coefficients (to aid in linear interpolation), or have filters for a multi-stage SRC.

In one embodiment of the present invention, four sets of filter coefficients are stored in a single ROM. A high order interpolator is based on a cubic spline approximation. The exceptional accuracy of this approximation makes it a good choice despite its relatively complex implementation. This invention may be extended to storing any number of sets of filter coefficients in the coefficient memory.

A preferred embodiment of the invention is implemented in an audio amplification system. As noted above, pulse width modulation (PWM) technology has recently been applied in audio amplification systems, but has suffered from the drawbacks of conventional methodologies. These methodologies employ analog modulation schemes which are very complex and costly, and which provide relatively poor performance. The present systems and methods are instead implemented in digital modulation schemes and employ methodologies which overcome some of the problems that existed in the prior art.

Referring to FIG. 1, a functional block diagram illustrating a digital audio amplification system using PWM technology is shown. In this embodiment, system 100 receives a digital input data stream from a data source such as a CD player, MP3 player, digital audio tape, or the like. The input data stream is received by sample rate converter 110. The input data stream has a particular sample rate which depends upon the data source. This sample rate is typically one of a set of predetermined sample rates that are used by the corresponding type of device. For example, a CD player may output digital data with a sample rate of 44.1 kHz, while a digital audio tape player may output data with a sample rate of 32 kHz.

In the present systems and methods, sample rate converter 110 converts the input data stream from the sample rate at which it was received to a predetermined internal rate which is used within system 100. In one embodiment, this internal sample rate is 100 kHz. Thus, if data is received at a sample rate of 50 kHz, sample rate converter 110 will re-sample the data to produce a corresponding internal data stream at a sample rate of 100 kHz. This internal data stream is then provided to an audio effects subsystem 120. Audio effects subsystem 120 performs any desired processing on the internal data stream and provides the resulting processed data stream to PWM modulator 130.

The data stream received by PWM modulator 130 represents a pulse code modulated signal. PWM modulator 130 converts this data stream to a pulse width modulated signal. The pulse width modulated signal is then provided to output stage 140. In output stage 140 amplifies the pulse width modulated signal and may perform some filtering or further processing of the amplified signal. The resulting signal is then output to a speaker system 150, which converts the electrical signal to an audible signal which can be heard by a listener.

The present disclosure focuses on the sample rate converter in the audio system described above. As explained above, the purpose of the sample rate converter is to receive an input data stream which is sampled at a first rate, and to generate an output data stream which is sampled at a second rate. While the audio signal which is represented by the data stream remains essentially unchanged (at least in some embodiments), the sampling rate is changed to conform to the requirements of the audio system so that it can be processed by the system.

Figure 2:
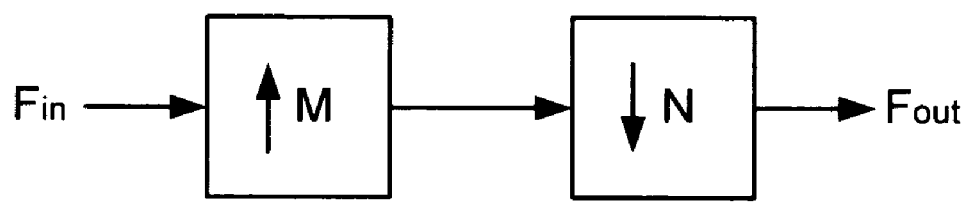
FIG. 2 is a diagram illustrating the manner in which sample rate conversion is typically performed.

Referring to FIG. 2, a diagram illustrating the manner in which sample rate conversion is typically performed is shown. As depicted by this figure, an input data stream is first up-sampled, or interpolated, by a first filter 210, and is down-sampled, or decimated, by a second filter 220. An intermediate filter 230 is used to low-pass filter the up-sampled data before it is decimated. The input data stream has a first sample rate, Fin. This data stream is up-sampled by a factor of M. Thus, after up-sampling, the data stream has a sample rate of M×Fin. The up-sampling is typically achieved by interpolating between the samples of the input data stream to generate intermediate samples. M is chosen so that the intermediate sample rate (M×Fin) is higher than the desired output sample rate, Fout. Typically, the intermediate rate is much higher than the desired output rate.

The up-sampled data stream is low-pass filtered and then decimated to reduce the sample rate from the intermediate rate to the desired output rate. After down-sampling, the sample rate is Fout=(M/N)×Fin. The down-sampling, or decimation, of the data stream is typically accomplished by dropping samples from the intermediate data stream. For example, if the intermediate data stream is sampled at 200 kHz and the desired output sample rate is 100 kHz, every other sample will be dropped.

Ideally, M and N are integers. If M is an integer, the up-sampling of the input data stream comprises inserting M−1 new samples, evenly spaced between each of the original samples. Then, if N is an integer, the down-sampling of the intermediate data stream comprises taking only every Nth sample and dropping the rest. This is illustrated in FIG. 3.

Figure 3:
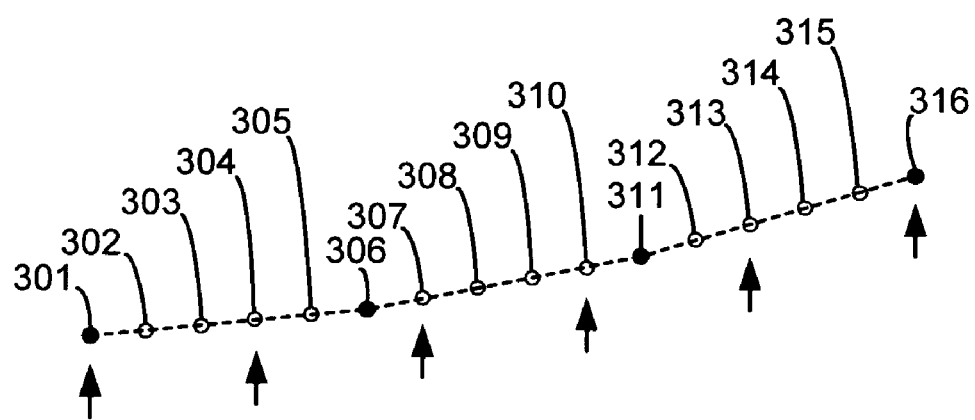
FIG. 3 is a diagram illustrating the interpolation and decimation of a sampled input signal to produce a corresponding signal at a different sample rate.

FIG. 3 is a diagram illustrating the interpolation and decimation of a sampled input signal to produce a corresponding signal at a different sample rate. In this figure, the input samples are represented by points 301, 306, 311 and 316. The straight-line interpolated value of the signal is represented by the dotted lines. The signal is up-sampled by a factor of 5, so 4 additional sample points are interpolated between each pair of adjacent samples. Thus, points 302-305 are inserted in the interval between sample 301 and sample 306. Likewise, points 307-310 are inserted between samples 306 and 311, and points 312-315 are inserted between samples 311 and 316. After being low-pass filtered, the resulting points (301-316) are down-sampled by a factor of 3, so every third point is used, and the remainder are discarded. The resulting data stream consists of samples 301, 304, 307, 310, 313 and 316 (as indicated by the arrows).

One of the problems with a straightforward implementation of the up-sampling and down-sampling of the input data stream is that, in order to make M and N integers, and in order to maintain the desired resolution, M and N typically must be very large numbers. Consider the example of FIG. 3. If $F_{in}$ is 60 kHz and $F_{out}$ is 100 kHz, M is 5 and N is 3. If $F_{in}$ were 60.5 kHz instead of 60 kHz, however it would be necessary to select M=200 and N=121. Scenarios requiring even higher values for M and N can easily be developed. Based upon the resolution of the sample rate converter in the preferred embodiment, values of up to $2^{18}$ might be necessary.

Another problem with the interpolation-and-decimation methodology is that it may be difficult to handle variations in the sample rates of the received data streams. In typical audio systems, each device or component may generate its own clock signal upon which the corresponding sample rate is based. Even if the clock signals for two components are intended to be identical, however, the clock signals are not synchronized and may have slight variations. As a result of the differences in clock signals, data may be dropped, or buffers may overflow, resulting in errors. The present sample rate converter is designed to handle these differences.

It should be noted that audio systems may also include various different types of audio sources. For example, the audio signal may be generated by a CD player, MP3 player, digital audio tape or the like. These devices may be configured to generate audio signals at different sample rates. For instance, a CD player may provide an output signal that has a 44.1 kHz sample rate, while a digital audio tape player may generate an output signal at a 32 kHz sample rate. The present systems and methods enable the sample rate converter to accommodate multiple different sample rates in the input data stream. Moreover, the sample rate converter is capable of independently adjusting each channel to accommodate a different input sample rate. By comparison, prior art systems can only accommodate different sample rates on different channels if the two sample rates are known.

The accommodation of different sample rates, and variations between rates that are nominally the same, may be achieved through the use of a polyphase filter. The polyphase filter performs the functions of both interpolator 210 and decimator 220. The polyphase filter performs these functions by interpolating the input data stream in a manner which does not require that the data stream be up-sampled by an integer factor or down-sampled by an integer factor.

The interpolator and the decimator described above are typically implemented as (FIR-type) filters. The polyphase filter is obviously also a filter, but rather than generating a large number of samples (as performed by the interpolation filter) and then throwing away unneeded samples and (as performed by the decimation filter), the polyphase filter generates only those samples that will, in the end, be retained. Thus, compared to the example of FIG. 3, rather than generating samples 301-316 and then discarding two-thirds of these samples, only samples 301, 304, 307, 310, 313 and 316 are generated, and none are discarded.

The polyphase filter is defined by a set of filter coefficients. If the coefficients are extrapolated to a different set of coefficients, different sampling rates are achieved. This enables non-integer sample rate conversion through the choice of appropriate filter coefficients.

A typical sample rate converter that uses polyphase filters contains memory for a single set of filter coefficients. Because the present systems and methods use an interpolator to generate appropriate coefficients for convolution with the samples of the input data stream, a greatly reduced number of coefficients can be stored in memory for use by the interpolator. This, in turn, reduces the amount of memory required for storage of the coefficients. It is therefore practical to store coefficients corresponding to several different filters in the coefficient memory.

In one embodiment, four sets of coefficients corresponding to four different filters are stored in the memory. Referring to FIG. 5, a diagram illustrating the use of the different filter coefficients (hence different filters) is shown. In this embodiment, an address generator 510 is used to select the appropriate set of filter coefficients from memory 530 by controlling a multiplexer 520 that provides the coefficients to the interpolator 540. In one embodiment, address generator 510 also controls selection of particular coefficients within each set for use by interpolator 540. Interpolator 540 and coefficient memory 530 are integrated into the sample rate converter as described in relation to FIG. 4 (where the interpolator and memory are combined in the figure as interpolation unit 460).

In one embodiment, the selection of one of the sets of filter coefficients is based upon the contents of a filter selection register. In the case of a system that has four available sets of filter coefficients, the filter selection register may contain a simple, 2-bit value that can range from 0-3. In the embodiment described above, address generator 510 may examine the contents of the filter selection register as part of the process of generating addresses for controlling multiplexer 520. The contents of the filter selection register may be automatically updated by a DSP internal to the system, or they may be altered manually through user input to the system.

Figure 4:
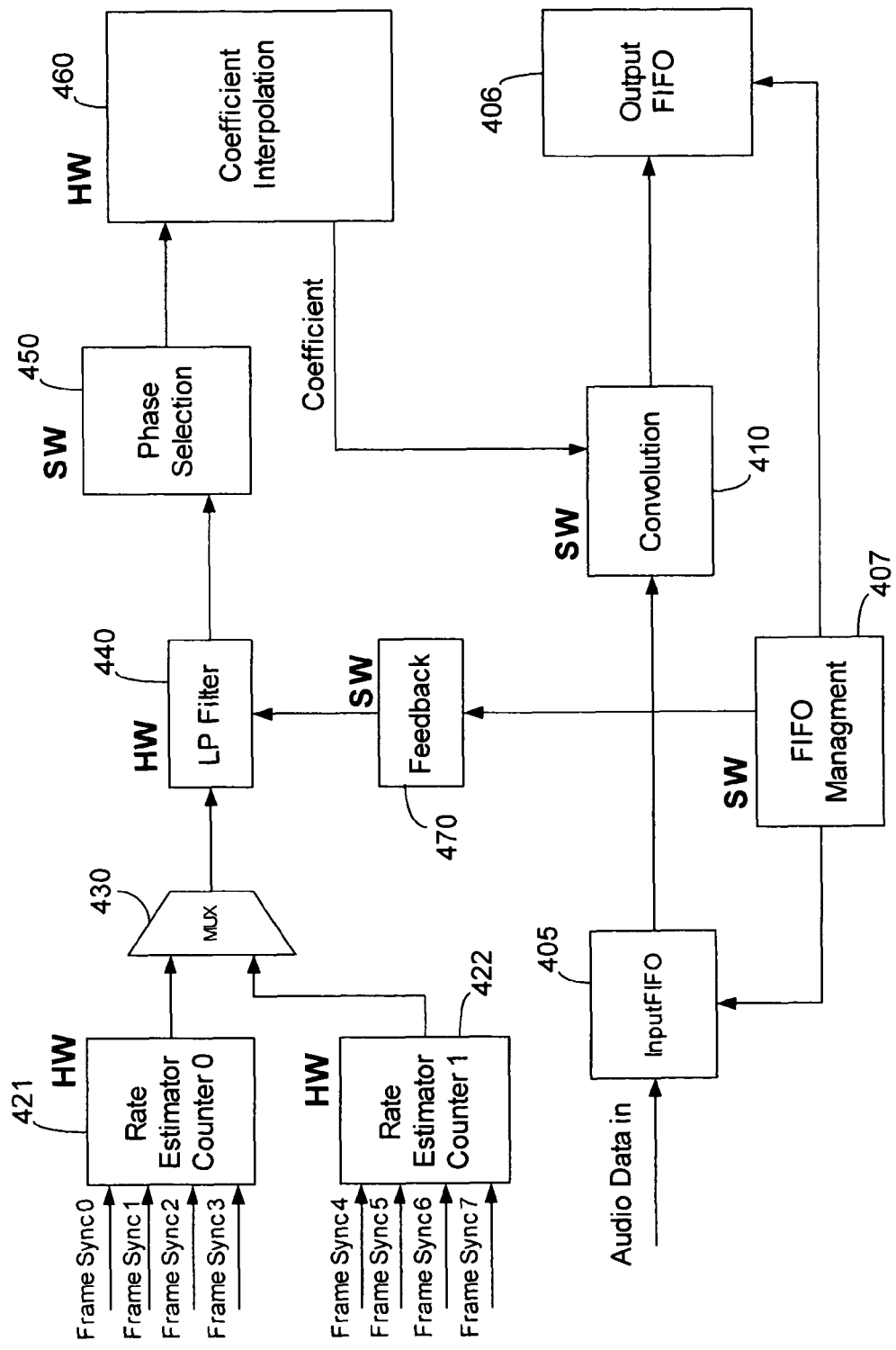
FIG. 4 is a diagram illustrating the components of a sample rate converter in accordance with one embodiment of the invention.
Figure 5:
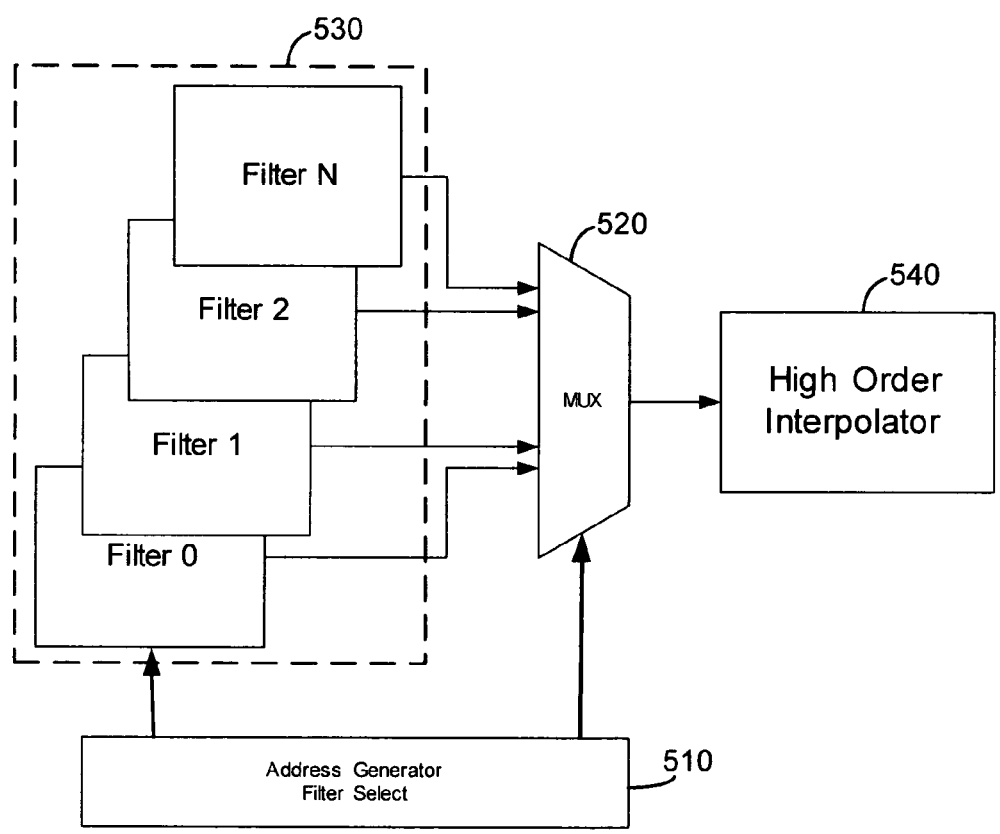
FIG. 5 is a diagram illustrating the storage of multiple, different sets of filter coefficients in a memory for use by an interpolator in a sample rate converter in accordance with one embodiment.

Referring to FIG. 4, a diagram illustrating the components of a sample rate converter in accordance with one embodiment of the invention is shown. The lower half of the figure generally corresponds to a data path for the audio data that will be converted, while the upper half of the figure corresponds to a control path for controlling the actual sample rate conversion. The control path includes the interpolator and the filter coefficient memory.

As shown in FIG. 4, samples of an audio data stream are received and stored in an input FIFO 405. The input data stream has a sample rate of $F_{in}$. The samples are read from FIFO 405 and convolved with a set of interpolated coefficients by convolution engine 410. Convolution engine 410 effectively up-samples or down-samples the data to produce samples at a rate equivalent to the output rate ($F_{out}$) of the sample rate converter. These samples are stored in an output FIFO 406. The samples are then read out of output FIFO 406 at rate $F_{out}$.

Frame sync signals associated with the audio data are received by rate estimator counters 421 and 422. Rate estimator counters 421 and 422 simply count the numbers of clock cycles between samples received on the respective channels. (It should be noted that, while the present embodiment has two channels, and corresponding rate estimators, other embodiments may handle N channels and have N corresponding sets of components.) One of the rate estimator counters is selected by multiplexer 430 and the corresponding count is filtered by low pass filter 440. The filtered sample rate count is forwarded to phase selection unit 450, and is used to interpolate the filter coefficients for the polyphase filter. The interpolated polyphase filter coefficients are then convolved with the data samples in convolution unit 410 to produce the re-sampled data.

The flow of data samples through FIFO 405 and FIFO 406 are managed by FIFO management unit 407. based on the flow of data, FIFO management unit 407 provides feedback to feedback unit 470. This feedback is used to adjust low pass filter 440. Effectively, this adjusts the sample rate which is estimated and thereby adjusts the coefficient interpolation performed in the sample rate converter. The sample rate conversion is thereby also adjusted to more closely track the actual input sample rate and to prevent the overflow or underflow of FIFOs 405 and 406.

In one embodiment, rate estimator counters 421 and 422 are 24-bit counters. Each can select from four input frame sync signals: SAI LRCK; SPDIF RX frame sync; Packet Data frame sync; and ESSI frame sync. The period measurement is accomplished by counting the number of DSP clock cycles within the counting period of the frame sync signal. The counting period is programmable, typically with the period equal to 1. In this embodiment, the count is multiplied by a gain. The gain is a 12-bit integer which is typically set to a power of 2, which is equivalent to a 1-bit left shift which creates an additional bit of resolution.

Low pass filter 440 is, in one embodiment, a second-order IIR filter. This filter may, for example, comprise a pair of cascaded first-order IIR filters. Low pass filter 440 attenuates jitter in the count received from the rate estimator counter. This ensures that the count changes slowly, and thereby improves the quality of the sample rate conversion. The averaging process that is implemented by the low pass filter causes the potential for buffer underflow or overflow. This problem is corrected by implementing closed loop feedback in the software which adjusts a 24-bit offset that is added to the count value before the value is passed through low pass filter 440. In one embodiment, the filter coefficient of low pass filter 440 is adjustable to allow faster frequency and phase lock.

Coefficient interpolator 460 works in conjunction with the ROM in which the coefficients are stored and the ROM address generator that provides addresses for retrieval of the coefficients for use by the interpolator. The filter coefficients are actually stored in two ROMs—one stores even coefficients, while the other stores odd coefficients. Each of these two ROMs has corresponding halves of the multiple, selectable sets of filter coefficients. The interpolator performs a cubic spline interpolation. The interpolator employs a five-stage, two-cycle pipeline to perform the interpolation, thereby enabling resource sharing while maintaining a throughput of one interpolation per two clock cycles.

In one embodiment, the software of the sample rate converter is responsible for performing a number of tasks. For example, as mentioned above, rate estimator counters 421 and 422 multiply their respective counter values by a gain, but the gain is determined by the software. Similarly, the offset and filter coefficients for the low pass filter following the rate estimator counters are determined by the software. The software is further responsible for calculating the ratio of the input sample rate ($F_{in}$) to the output sample rate ($F_{out}$). Based upon the ratio of sample rates and the filtered counter values, the software determines the filter length, phase and phase increment for interpolation of the polyphase filter coefficients. Further, the software is responsible for convolving the polyphase filter coefficients with the input samples, managing the input and output FIFOs, and providing feedback for adjustment of the estimated input sample rate.

The software components are implemented in a data processor. Typical modern processors have the capability of executing tight loops very efficiently while reading in data streams. For example, digital signal processors (DSP's) have "zero overhead looping" capability. Modern microcontrollers also have the capability of executing multiple instructions per cycle. These DSP's and microcontrollers typically also have separate program and data memories that make them suitable for sample rate converter applications.

These processors have the capability, for example, to execute the following in one processor cycle: read a data sample from memory (as indicated by a sample pointer register); update the sample pointer register to point to a next sample; multiply the data sample by a coefficient value; and add (accumulate) the result of the multiplication in a data register. If the polyphase filter contains X coefficients, X clock cycles are used to compute one output sample.

Aside from the functions mentioned above, the sample rate converter is responsible for reading and interpolating the polyphase filter coefficients. A processor can handle a number of parallel channels Y at the same time, where Y is limited by the available number of accumulator and sample pointer registers. When Y channels are processed simultaneously using identical coefficients, relatively compact hardware can be designed to perform the following in Y or less cycles: read a number of coefficients from memory (as indicated by coefficient pointer); update a coefficient pointer register; and perform interpolation to calculate filter coefficients to a desired precision.

In "pseudo C" the processor would do the following:

```
for every output sample
    Initialize the hardware coefficient calculator
    for j=1 to Y
        o[Y] = 0;                  // Initialize accumulators
        p[Y] = start(N);           // Initialize pointers
    for i=1 to X                   // For every coefficient
        C = mem[coeff]             // Read coefficient
        for j=1 to Y               // For every channel
            o[Y] += C*mem[p[Y]++]
```

Typically, the inner loop using j would be unrolled, and reading the next coefficient would be done in parallel with the last iteration (j=Y). A simple and efficient processor would calculate a new coefficient for every Y cycles. A more flexible solution would calculate a coefficient in Y or fewer cycles. When a new sample becomes available, it will halt computations until this sample is read and thereby automatically adjust to the rate at which the DSP reads the filter coefficients. Besides making the actual value of Y more flexible, this also allows the processor to periodically halt the computations and service other functions like interrupts.

In some embodiments, components of the sample rate converter may be shared between two or more independent sample rate conversion paths. For instance, two different paths may both use the same interpolator hardware. Each of these paths may use the same set of polyphase filter coefficients, or different sets of coefficients, depending upon the implementation.

Those of skill in the art will understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. The information and signals may be communicated between components of the disclosed systems using any suitable transport media, including wires, metallic traces, vias, optical fibers, and the like.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with general purpose processors, digital signal processors (DSPs) or other logic devices, application specific integrated circuits (ASICs), field programmable gate arrays (FPGAs), discrete gates or transistor logic, discrete hardware components, or any combination thereof designed to perform the functions described herein. A general purpose processor may be any conventional processor, controller, microcontroller, state machine or the like. A processor may also be implemented as a combination of computing devices, e.g., a combination of a DSP and a microprocessor, a plurality of microprocessors, one or more microprocessors in conjunction with a DSP core, or any other such configuration.

The steps of the methods or algorithms described in connection with the embodiments disclosed herein may be embodied directly in hardware, in software or firmware modules executed by a processor, or in a combination thereof. A software product may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as detailed within the following claims.

What is claimed is:

1. A method comprising:
  (a) storing a plurality of independent sets of filter coefficients in a memory, wherein each set of filter coefficients defines a different polyphase filter function, wherein each of the different polyphase filter functions would result in at least some modifying of a signal if the signal were filtered in accordance with the polyphase filter function, and wherein each of the different polyphase filter functions would result in modifying of a signal in a different manner than the other polyphase filter functions;

(b) storing a value in a filter selection register;
(c) selecting a single one of the independent sets of filter coefficients based on the value stored in the filter selection register;
(d) receiving an audio input signal including a plurality of samples;
(e) estimating a sample rate of the audio input signal;
(f) interpolating the single one selected set of filter coefficients, in dependence on the estimated sample rate of the audio input signal, to thereby produce interpolated polyphase filter coefficients; and
(g) convolving the produced interpolated polyphase filter coefficients with the samples of the audio input signal to produce a filtered audio output signal that differs from the audio input signal regardless of which single one of the sets of filter coefficients is selected;
wherein said selecting the single one of the independent sets of filter coefficients at step (c) is performed prior to receiving the audio input signal at step (d), independent of the audio input signal received at step (d), and independent of the filtered audio output signal produced at step (g); and
wherein the same single one of the sets of filter coefficients selected at step (c) is used at steps (f) and (g) to produce the filtered audio output signal produced at step (g).

2. The method of claim 1, wherein the audio input signal is convolved with the interpolated filter coefficients in a sample rate converter of a digital pulse width modulation (PWM) audio amplifier.

3. The method of claim 1, wherein the plurality of sets of filter coefficients are stored in a single memory.

4. The method of claim 1, wherein the single one selected set of filter coefficients are interpolated according to a cubic spline algorithm.

5. The method of claim 1, wherein each of the plurality of sets of filter coefficients comprise polyphase filter coefficients.

6. A system comprising:
a coefficient interpolator;
a filter selection register;
a memory coupled to the coefficient interpolator; and
a sample rate estimator configured to estimate a sample rate of an audio input signal;
a convolution engine coupled to the coefficient interpolator;
wherein the memory is configured to store multiple independent sets of filter coefficients, wherein each set of filter coefficients defines a different polyphase filter function, wherein each of the different polyphase filter functions would result in at least some modifying of a signal if the signal were filtered in accordance with the polyphase filter function, and wherein each of the different polyphase filter functions would result in modifying of a signal in a different manner than the other polyphase filter functions; and
wherein the coefficient interpolator is configured to interpolate a selected single one of the independent sets of filter coefficients, in dependence on the estimated sample rate of the audio input signal, to thereby produce interpolated polyphase filter coefficients; and
wherein the selected single of one of the independent sets of filter coefficients is selected based on contents of the filter selection register, independent of the audio input signal received, and independent of a filtered audio output signal produced;
wherein the same single one of the sets of filter coefficients selected is used to produce the filtered audio output signal; and
wherein the convolution engine is configured to convolve the audio input signal with the produced interpolated polyphase coefficients corresponding to the selected single one of the sets of filter coefficients to produce the filtered audio output signal that differs from the audio input signal regardless of which one of the sets of filter coefficients is selected.

7. The system of claim 6, wherein:
the convolution engine is implemented in a sample rate converter of a pulse width modulation (PWM) amplifier.

8. The system of claim 6, wherein the memory comprises a single memory module configured to store the multiple sets of filter coefficients.

9. The system of claim 8, wherein each of the multiple independent sets of filter coefficients comprise polyphase filter coefficients.

10. The system of claim 6, wherein the coefficient interpolator is configured to interpolate the selected set of filter coefficients according to a cubic spline algorithm.

11. A method comprising:
storing a plurality of independent sets of filter coefficients in a memory, wherein each set of filter coefficients defines a different polyphase filter function, wherein each of the different polyphase filter functions would result in at least some modifying of a signal if the signal were filtered in accordance with the polyphase filter function, and wherein each of the different polyphase filter functions would result in modifying of a signal in a different manner than the other polyphase filter functions;
storing a value in a filter selection register;
selecting a single one of the sets of filter coefficients based on the value stored in the filter selection register;
receiving an audio data signal and frame sync signals associated with the audio data signal;
estimating, based on the frame sync signals, a sample rate of the audio data signal;
interpolating the single one selected set of filter coefficients, in dependence on the estimated sample rate of the received audio data signal, to thereby produce interpolated polyphase filter coefficients; and
convolving the produced interpolated polyphase filter coefficients with the received audio data signal to produce a filtered audio data signal that differs from the received audio data signal regardless of which single one of the sets of filter coefficients is selected;
wherein said selecting the single one of the independent sets of filter coefficients is performed prior to receiving the audio data signal, independent of the audio data signal received, and independent of the filtered audio data signal produced; and
wherein the same single one of the sets of filter coefficients selected is used to produce the filtered audio data signal.

12. The method of claim 11, further comprising performing the method in a sample rate converter of a digital PWM amplifier.

13. The method of claim 1, wherein the plurality of sets of filter coefficients are stored in the memory prior to receiving the input signal, and wherein the filter function defined by each set of filter coefficients corrects distortion in the output signal.

14. The system of claim 6, wherein the memory is configured to store the multiple sets of filter coefficients prior to receiving an input signal, and wherein the filter function defined by each set of filter coefficients corrects distortion in an output signal produced by convolving the input signal with interpolated coefficients based on the corresponding set of filter coefficients.

15. The method of claim 11, wherein the plurality of sets of filter coefficients are stored in the memory prior to receiving the audio data signal, and wherein the filter function defined by each set of filter coefficients corrects distortion in the produced filtered audio signal.

16. The method of claim 1, wherein the output signal, resulting from the convolving step, is dependent on which single one of the independent sets of filter coefficients is selected, such that for the same input signal a different output signal would be produced if a different one of the independent sets of filter coefficients were selected.

17. The system of claim 6, wherein the output signal, produced by the convolution engine, is dependent on which single one of the independent sets of filter coefficients is selected, such that for the same input signal a different output signal would be produced if a different one of the independent sets of filter coefficients were selected.

18. The method of claim 11, wherein the filtered audio data signal, resulting from the convolving step, is dependent on which one of the independent sets of filter coefficients is the single one selected, such that for the same received audio data signal a different filtered audio data signal would be produced if a different one of the independent sets of filter coefficients were the single one selected.

* * * * *

UNITED STATES PATENT AND TRADEMARK OFFICE
CERTIFICATE OF CORRECTION

| | | |
|---|---|---|
| PATENT NO. | : 7,908,306 B1 | Page 1 of 1 |
| APPLICATION NO. | : 10/805596 | |
| DATED | : March 15, 2011 | |
| INVENTOR(S) | : Chieng et al. | |

It is certified that error appears in the above-identified patent and that said Letters Patent is hereby corrected as shown below:

On the title page, item [73], insert the following: --Assignee: D2Audio Corporation, Milpitas, CA (US)--.

Signed and Sealed this
Twenty-third Day of August, 2011

David J. Kappos
*Director of the United States Patent and Trademark Office*